US012787802B2

(12) United States Patent
Vercambre et al.

(10) Patent No.: US 12,787,802 B2
(45) Date of Patent: Nov. 3, 2026

(54) POWER MODULE WITH OVERMOULDING, DEVICES COMPRISING SUCH A POWER MODULE AND METHOD FOR MANUFACTURING A POWER MODULE WITH OVERMOULDING

(71) Applicant: VALEO EQUIPEMENTS ELECTRIQUES MOTEUR, Creteil Cedex (FR)

(72) Inventors: Virginie Vercambre, Creteil Cedex (FR); Yavier Alejandro Gomez-Vasquez, Creteil Cedex (FR); Lyes Haddad, Creteil Cedex (FR); Luc Demarez, Sable sur Sarthe (FR); Hicham Aytous, Sable sur Sarthe (FR)

(73) Assignee: VALEO EQUIPEMENTS ELECTRIQUES MOTEUR, Creteil Cedex (FR)

( * ) Notice: Subject to any disclaimer, the term of this patent is extended or adjusted under 35 U.S.C. 154(b) by 989 days.

(21) Appl. No.: 17/995,064

(22) PCT Filed: Mar. 30, 2021

(86) PCT No.: PCT/EP2021/058252
§ 371 (c)(1),
(2) Date: Sep. 29, 2022

(87) PCT Pub. No.: WO2021/198230
PCT Pub. Date: Oct. 7, 2021

(65) Prior Publication Data

US 2023/0128774 A1 Apr. 27, 2023

(30) Foreign Application Priority Data

Mar. 30, 2020 (FR) ..................................... 20 03115

(51) Int. Cl.
*H10W 70/40* (2026.01)
*H02M 7/797* (2006.01)
(Continued)

(52) U.S. Cl.
CPC ...... *H10W 70/466* (2026.01); *H05K 7/14329* (2022.08); *H10W 70/481* (2026.01);
(Continued)

(58) Field of Classification Search
None
See application file for complete search history.

(56) References Cited

U.S. PATENT DOCUMENTS 5,834,842 A * 11/1998 Majumdar .......... H10W 70/427 257/E23.047
2009/0115055 A1 5/2009 Hashimoto
(Continued)

FOREIGN PATENT DOCUMENTS

CN 102655280 A 9/2012
CN 103229397 A 7/2013
(Continued)

OTHER PUBLICATIONS

Combined Chinese Office Action and Search Report issued Apr. 16, 2025 in Chinese Patent Application No. 202180026517.6 (with English translation of Office Action and English translation of Categories of Cited documents), 14 pages.
(Continued)

*Primary Examiner* — Sue A Purvis
*Assistant Examiner* — Jordan M Klein
(74) *Attorney, Agent, or Firm* — Oblon, McClelland, Maier & Neustadt, L.L.P.

(57) ABSTRACT

A power module having electrical connection parts, preferably made of metal, each having a main plate, the main plates extending in one and the same main plane so as to be
(Continued)

substantially coplanar. At least one of the electrical connection parts includes at least one electrical connector projecting from its main plate. At least one transistor is electrically connected between two upper faces of respectively two of the main plates, and an electrically insulating overmolding, for example made of resin, covers each transistor and at least one portion of the upper faces of the main plates.

14 Claims, 23 Drawing Sheets

(51) Int. Cl.

| | |
|---|---|
| ***H05K 7/14*** | (2006.01) |
| ***H10W 72/00*** | (2026.01) |
| ***H10W 72/50*** | (2026.01) |
| ***H10W 72/60*** | (2026.01) |
| ***H10W 74/10*** | (2026.01) |
| ***H10W 90/00*** | (2026.01) |

(52) U.S. Cl.
CPC ........ *H10W 72/652* (2026.01); *H10W 74/114* (2026.01); *H10W 90/00* (2026.01); *H10W 90/811* (2026.01); *H02M 7/797* (2013.01); *H10W 70/429* (2026.01); *H10W 72/5522* (2026.01); *H10W 72/5524* (2026.01); *H10W 72/871* (2026.01); *H10W 90/756* (2026.01); *H10W 90/766* (2026.01)

(56) References Cited

U.S. PATENT DOCUMENTS

| | | | | |
|---|---|---|---|---|
| 2014/0001618 | A1 | 1/2014 | Cruz et al. | |
| 2020/0312754 | A1* | 10/2020 | Yasuda ............. | H01L 23/49582 |
| 2021/0249341 | A1* | 8/2021 | Kawahara ......... | H01L 23/49555 |

FOREIGN PATENT DOCUMENTS

| | | | |
|---|---|---|---|
| CN | 107046373 | A | 8/2017 |
| EP | 3 584 833 | A1 | 12/2019 |
| FR | 3 068 564 | A1 | 1/2019 |
| FR | 3 082 306 | A1 | 12/2019 |
| FR | 3 082 369 | A1 | 12/2019 |
| JP | 3-289162 | A | 12/1991 |
| JP | 2011-129818 | A | 6/2011 |
| JP | 2019-186321 | A | 10/2019 |
| WO | WO-2019/233771 | A1 | 12/2019 |
| WO | WO-2019/233772 | A1 | 12/2019 |

OTHER PUBLICATIONS

International Search Report issued Jun. 21, 2021 in PCT/EP2021/058252 filed on Mar. 30, 2021, 3 pages.

* cited by examiner

POWER MODULE WITH OVERMOULDING, DEVICES COMPRISING SUCH A POWER MODULE AND METHOD FOR MANUFACTURING A POWER MODULE WITH OVERMOULDING

BACKGROUND OF THE INVENTION

Field of the Invention

The present invention relates to a power module with overmolding, an electronic system and a voltage converter having such a power module, and to a method for manufacturing such a power module with overmolding.

Description of the Related Art

The French patent application published under the number FR 3 068 564 A1 describes a power module having:

- electrical connection parts, preferably made of metal, each having a main plate, the main plates extending in one and the same main plane so as to be substantially coplanar, at least one of the electrical connection parts comprising at least one electrical connector projecting from its main plate;
- at least one transistor electrically connected between two upper faces of respectively two of the main plates; and
- an electrically insulating overmolding, for example made of resin, covering each transistor and at least a portion of the upper faces of the main plates.

Such a power module may be used in a motor vehicle, for example. However, in such an environment, the power module may be subjected to relatively significant mechanical vibrations.

A drawback of such a power module is that the overmolding risks becoming detached over time, for example due to the mechanical vibrations mentioned above.

BRIEF SUMMARY OF THE INVENTION

It may thus be desirable to provide a power module which makes it possible to alleviate at least some of the aforementioned problems and constraints.

Therefore, what is proposed is a power module having:

- electrical connection parts, preferably made of metal, each having a main plate, the main plates extending in one and the same main plane so as to be substantially coplanar, at least one of the electrical connection parts comprising at least one electrical connector projecting from its main plate;
- at least one transistor electrically connected between two upper faces of respectively two of the main plates; and
- an electrically insulating overmolding, for example made of resin, covering each transistor and at least a portion of the upper faces of the main plates;

characterized in that at least one of the electrical connection parts moreover has at least one attachment tenon for attaching to the overmolding, separate from the electrical connector(s) of this electrical connection part if the latter comprises them, each attachment tenon projecting solely in one projection direction in the main plane from an edge surface of the main plate of this electrical connection part, and in that the overmolding at least partially covers the attachment tenon.

By virtue of the invention, the contact surface area between the overmolding and the connection parts is increased compared to the case without a tenon, thereby making it possible for the main plates to be better retained by the overmolding.

A power module according to the invention may moreover comprise one or more of the following optional features, taken individually or in any technically possible combination.

According to a first feature, the electrical connector projects from the main plate in the main plane.

According to another feature, the transistor has a lower face held against the upper face of one of the main plates to which the transistor is connected.

According to another feature, the attachment tenon and the main plate bearing it are made in one piece by a continuation of material.

According to another feature, the electrical connector and the main plate bearing it are made in one piece by a continuation of material.

According to another feature, the power module has two transistors, for example having lower faces held respectively against the upper faces of the main plates of two different connection parts or against the upper face of the main plate of one and the same connection part.

According to another feature, at least one of the electrical connector(s) projects at least partially in the main plane.

According to another feature, each of the electrical connection parts comprises at least one electrical connector projecting from its main plate.

According to another feature, the overmolding is integral in one single piece.

According to another feature, each transistor, for the one part, has a lower face held against one of the two upper faces to which this transistor is electrically connected and, for the other part, is electrically connected, for example via one or more tapes or wires, to the other one of the two upper faces.

According to another feature, at least one of the main plates has, on a lower face, at least one first cavity filled by the overmolding, and the overmolding has, in this cavity, a lower face flush with the lower face of the main plate.

According to another feature, each first cavity is open on the edge surface of the main plate having this cavity.

According to another feature, each electrical connector has a fixed end secured to the main plate, this fixed end having a lower face completely uncovered by the overmolding.

According to another feature, the overmolding has a downwardly projecting pad.

According to another feature, the main plates are separated from one another in the main plane by at least one gap and the overmolding fills each gap and has, in each gap, a lower face flush with the lower faces of the main plates.

According to another feature, the pad projects from the lower face of the overmolding present in the gap.

According to another feature, the projection direction of the attachment tenon is substantially perpendicular to the edge surface of the main plate from which the attachment tenon projects.

According to another feature, the attachment tenon has a length, in its projection direction, of less than or equal to 5 mm.

According to another feature, the electrical connection parts are obtained by being cut from a metal plate.

According to another feature, the attachment tenon is formed by a fastening lug residue resulting from making a cut in a fastening lug connecting, before the cutting, the main plate to another plate coplanar with said metal plate.

According to another feature, the attachment tenon is located on an external edge surface portion of the main plate.

According to another feature, each at least one of the attachment tenon(s) has a thickness, and a width greater than or equal to its width.

According to another feature, the attachment tenon is completely covered by the overmolding.

According to another feature, each attachment tenon has:

a fixed end secured to the edge surface of the main plate, an upper face, a lower face, two lateral faces, and a front face, and the overmolding at least partially covers one or more of the following: the lower face, the upper face, the lateral faces and the front face of each attachment tenon.

According to another feature, the overmolding leaves the lower face of at least one of the attachment tenon(s) at least partially uncovered.

According to another feature, the overmolding has at least one second cavity leaving the upper face of at least one of the attachment tenon(s) at least partially uncovered.

According to another feature, the cavity delimits a free volume encompassing a right cylinder having a circular base in the main plane, this circular base having a diameter of between 3 and 5 mm, preferably 4 mm, and a center located at a distance of between 0.5 and 1.5 mm, preferably 1 mm, from a line of the main plane connecting the two portions of an edge surface of the overmolding surrounding the cavity.

According to another feature, the center of the circular base is located vertically with respect to a middle of a width of the attachment tenon.

According to another feature, the overmolding has a peripheral protuberance at least partially bordering an external edge of the overmolding in the main plane and projecting further downward than the lower face of the main plate(s), this peripheral protuberance at least partially covering the lower face of at least one of the attachment tenon(s).

According to another feature, the peripheral protuberance covers the attachment tenon at the front of its fixed end so as to leave the lower face of the attachment tenon uncovered at its fixed end.

According to another feature, the front face of at least one of the attachment tenon(s) that has a lower face covered by the peripheral protuberance is completely covered by the overmolding, for example by the peripheral protuberance of the overmolding.

According to another feature, the front face of at least one of the attachment tenon(s) is completely covered by the overmolding.

According to another feature, at least one of the attachment tenon(s) protrudes beyond the overmolding in its projection direction by a distance of less than 2 mm.

According to another feature, the power module has two attachment tenons projecting from the edge surface of the same main plate, and the overmolding at least partially covers, for the one part, a portion of the edge surface extending between the two attachment tenons and, for the other part, the facing lateral faces of these two attachment tenons.

According to another feature, the overmolding leaves visible at least a portion of a lower face of the main plate of at least one electrical connection part, this portion left visible being designed to be held against a heat sink.

According to another feature, a transistor is held against the main plate that has a portion of the lower face left visible by the overmolding so as to be held against the heat sink.

What is likewise proposed is an electronic system comprising a heat sink and a power module according to the invention, and in which the heat sink is in thermal contact with at least one lower face left visible by the overmolding.

According to an optional feature, the heat sink is in thermal contact with at least a portion of the lower face left visible by the overmolding via an electrically insulating thermal connection element.

According to another optional feature, the pad comes into contact with the heat sink in order to control the thickness of the electrically insulating thermal connection element present between the heat sink and the lower face(s) of the main plate(s) left uncovered by the overmolding.

What is likewise proposed is a voltage converter comprising a power module according to the invention or an electronic system according to the invention.

What is likewise proposed is a method for manufacturing a power module, having the following steps:

obtaining a conductive plate, preferably made of metal, extending in a main plane;

cutting, from the conductive plate, for the one part, a frame part and multiple planar parts having at least two electrical connection parts each having a main plate, the main plates extending in the main plane so as to be substantially coplanar, at least one of the electrical connection parts comprising at least one electrical connector projecting from its main plate, and, for the other part, fastening lugs for fastening each main plate to at least one of the other part(s);

electrically connecting at least one transistor between two upper faces of respectively two main plates;

producing, with an electrically insulating material, for example resin, an overmolding for the transistor and at least a portion of the upper faces of the main plates; and cutting the fastening lugs in order to separate each electrical connection part from the other part(s);

characterized in that the fastening lugs are cut so as to leave a fastening lug residue projecting from one of the main plates and forming an attachment tenon for attaching to the overmolding projecting from the main plate in the main plane, separate from the electrical connector(s) of this electrical connection part if the latter comprises them, each attachment tenon projecting solely in one projection direction in the main plane from an edge surface of the main plate of this electrical connection part, and in that the overmolding is made so as to at least partially cover the attachment tenon.

A method according to the invention may moreover have one or more of the following optional features, taken individually or in any technically possible combination.

According to a first feature, the overmolding is made by casting or injection molding electrically insulating material into a mold in one go.

According to another feature, the overmolding is made before the fastening lugs are cut.

According to another feature, the overmolding is made after the fastening lugs have been cut.

According to another feature, the cutting of the fastening lugs includes cutting a first portion of the fastening lugs, then producing the overmolding, and then cutting a second portion of the fastening lugs.

According to another feature, the production of the overmolding includes producing a portion of the overmolding, then cutting the fastening lugs, and then producing a second portion of the overmolding.

According to another feature, the overmolding is made so as to have at least one cavity leaving an upper face of at least one of the attachment tenon(s) at least partially uncovered.

According to another feature, the cavity delimits a free volume encompassing a right cylinder having a circular base in the main plane, this circular base having a diameter of between 3 and 5 mm, preferably 4 mm, and a center located at a distance of between 0.5 and 1.5 mm, preferably 1 mm, from a line of the main plane connecting the two portions of an edge surface of the overmolding surrounding the cavity.

According to another feature, the cutting of the fastening lugs includes first of all placing a reinforcing part against the upper face of at least one of the fastening lugs, this upper face being uncovered by the cavity, and then cutting the fastening lug 2104 from bottom to top with a cutting tool in order to create a sheared effect with the reinforcing part.

BRIEF DESCRIPTION OF THE SEVERAL VIEWS OF THE DRAWINGS

The invention will be better understood from the following description, which is provided solely by way of example with reference to the appended drawings, in which.

DETAILED DESCRIPTION OF THE INVENTION

Figure 1:
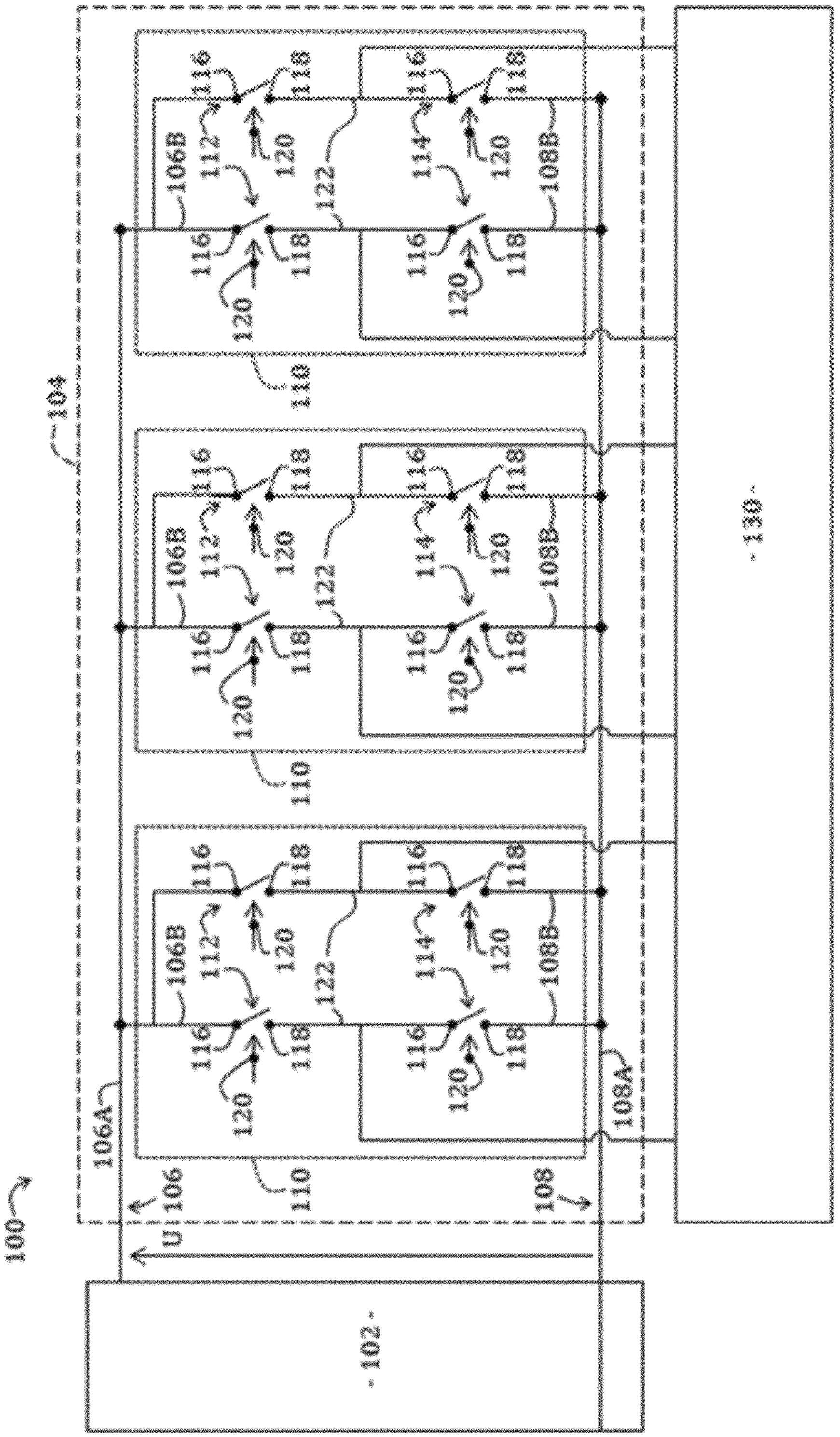
FIG. 1 schematically shows an electrical system having a voltage converter implementing the invention.

An electrical system 100 implementing the invention will now be described with reference to FIG. 1.

The electrical system 100 is intended to be installed in a motor vehicle, for example.

The electrical system 100 first of all has an electrical power source 102 designed to supply a DC voltage U, for example of between 10 V and 100 V, for example 48 V or 12 V. The electrical power source 102 has a battery, for example.

The electrical system 100 moreover has an electric machine 130 having multiple phases (which are not shown) that are intended to have respective phase voltages.

The electrical system 100 moreover has a voltage converter 104 connected between the electrical power source 102 and the electric machine 130 in order to perform a conversion between the DC voltage U and the phase voltages.

The voltage converter 104 first of all has a positive busbar 106 and a negative busbar 108 that are intended to be connected to the electrical power source 102 to receive the DC voltage U, the positive busbar 106 receiving a high electrical potential and the negative busbar 108 receiving a low electrical potential.

The voltage converter 104 moreover has at least one power module 110 having one or more phase busbars 122 that are intended to be respectively connected to one or more phases of the electric machine 130 in order to supply their respective phase voltages.

In the example described, the voltage converter 104 has three power modules 110 each having two phase busbars 122 connected to two phases of the electric machine 130.

More specifically, in the example described, the electric machine 130 has two three-phase systems, each having three phases and intended to be electrically phase-shifted by 120° with respect to one another. Preferably, the first phase busbars 122 of the power modules 110 are respectively connected to the three phases of the first three-phase system, whereas the second phase busbars 122 of the power modules 110 are respectively connected to the three phases of the second three-phase system.

Each power module 110 comprises, for each phase busbar 122, a high-side switch 112 connected between the positive busbar 106 and the phase busbar 122, and a low-side switch 114 connected between the phase busbar 122 and the negative busbar 108. Thus, the switches 112, 114 are arranged so as to form a switching arm, in which the phase busbar 122 forms a center tap.

Each switch 112, 114 comprises first and second main terminals 116, 118 and a control terminal 120 intended to selectively open and close the switch 112, 114 between its two main terminals 116, 118 depending on a control signal that is applied thereto. The switches 112, 114 are preferably transistors, for example metal-oxide-semiconductor field-effect transistors (MOSFETs) having a gate forming the control terminal 120, and a drain and a source forming the main terminals 116, 118, respectively. As an alternative, the switches 112, 114 could be insulated-gate bipolar transistors (IGBTs).

In the example described, the switches 112, 114 each have the form of a plate that is, for example, substantially rectangular and that has an upper face and a lower face. The first main terminal 116 extends over the lower face, whereas the second main terminal 118 extends over the upper face. The switches 112, 114 are intended to be flowed through, between their main terminals 116, 118, by a current greater than 1 A.

It will be appreciated that the positive busbar 106, the negative busbar 108 and the phase busbars 122 are rigid electrical conductors designed to withstand electric currents of at least 1 A that are intended to flow through the switches 112, 114. They preferably have a thickness of at least 1 mm.

Moreover, in the example described, the positive busbar 106 first of all has a positive common busbar 106A connecting the power modules 110 and, in each power module 110, a positive local busbar 106B connected to the positive common busbar 106A. Similarly, the negative busbar 108 has a negative common busbar 108A connecting the power modules 110 and, in each power module 110, a negative local busbar 108B for each low-side switch 114, the negative local busbars 108B being connected to the negative common busbar 108B. The connections are shown as rhombuses in FIG. 1.

Moreover, in the example described, the positive common busbar 106A and the negative common busbar 108A are each formed from a single conductive part.

Moreover, in the example described, the electric machine 130 operates both as an alternator and as an electric motor. More specifically, the motor vehicle also has a combustion engine (not shown) having an output shaft, to which the electric machine 130 is connected via a belt (not shown). The combustion engine is intended to drive the motor vehicle wheels by way of its output shaft. Thus, when operating as an alternator, the electric machine 130 supplies the electrical power source 102 with electrical energy from the rotation of the output shaft. The voltage converter 104 then operates as a rectifier. When it operates as an electric motor, the electric machine drives the output shaft (in addition to or instead of the combustion engine). The voltage converter 104 then operates as an inverter.

The electric machine 130 is, for example, located in a gearbox or in a clutch of the motor vehicle or in place and instead of the alternator.

Throughout the remainder of the description, the structure and the layout of the elements of the voltage converter 104 will be described in more detail, with reference to a vertical direction H-B, with “H” representing the top and “B” representing the bottom.

Figure 2:
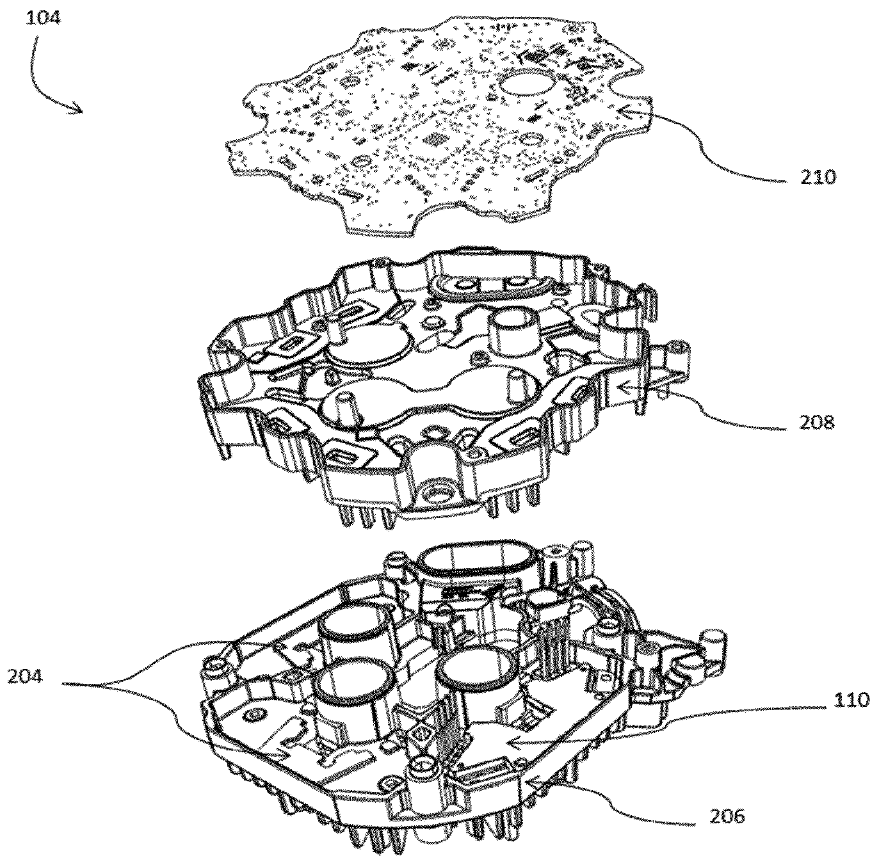
FIG. 2 is a three-dimensional exploded view of the voltage converter of FIG. 1.

With reference to FIG. 2, the voltage converter 104 comprises a heat sink 206, having heat exchange surfaces 204 on which the power modules 110 (a single power module 110 is shown in FIG. 2) are respectively mounted. Heat is exchanged between the heat exchange surface 204 of the heat sink 206 and the power module 110 for example by virtue of direct contact or contact made via a thermally conductive paste between the heat exchange surface 204 of the heat sink 206 and the power module 110.

The voltage converter 104 also comprises a support housing 208, on which a secondary electronic module, such as a control module 210, is secured. In the example of FIG. 1, the control module 210 is a control board. Moreover, and optionally, the support housing 208 is mounted on the heat sink 206.

Figure 3:
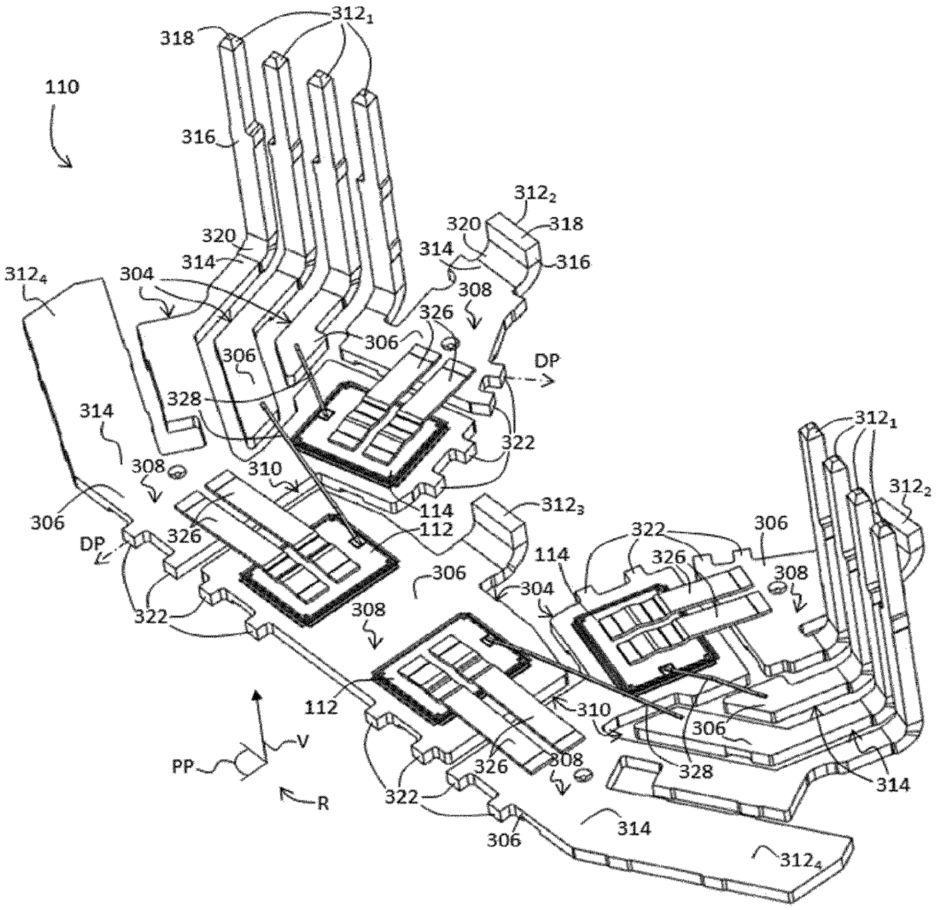
FIG. 3 is a three-dimensional top view of a power module of the voltage converter of FIG. 2, without overmolding.

With reference to FIG. 3, the power module 110 has multiple electrical connection parts 304, preferably made of metal.

Each electrical connection part 304 has a main plate 306 extending in a horizontal main plane PP, the same being the case for all the main plates 306 such that the main plates 306 are substantially coplanar. In particular, in the example described, the main plates 306 have respective horizontal upper faces 308 extending at the same height. For the sake of clarity, the upper faces 308 are shown in FIG. 3 only for the largest main plates 306.

Furthermore, the main plates 306 are separated from one another in the main plane PP by at least one gap 310. In the example described, the width of each gap 310 is less than or equal to five millimeters. This means that the two main plates delimiting the gap 310 are separated by at most five millimeters along this gap 310.

In general, at least one of the electrical connection parts 304 (all of them in the example described) moreover has at least one electrical connector projecting from its main plate 306. Each electrical connector is, for example, either in the form of a pin $\mathbf{312}_1$, or in the form of a folded tab $\mathbf{312}_2$, $\mathbf{312}_3$, or else in the form of a straight tab $\mathbf{312}_4$.

In the example described here, the straight tabs $\mathbf{312}_4$ form the phase busbars 122, the folded tab $\mathbf{312}_3$ forms the local busbar 106A and the folded tabs $\mathbf{312}_2$ form the negative local busbars 108B.

In the first two cases, each electrical connector $\mathbf{312}_1$, $\mathbf{312}_2$, $\mathbf{312}_3$ has a fixed end 314 secured to the main plate 306, a main portion 316 extending vertically in the example described and ending in a free end 318, and an elbow 320 connecting the fixed end 314 to the main portion 316. For the sake of clarity, these various elements of the electrical connectors $\mathbf{312}_1$, $\mathbf{312}_2$, $\mathbf{312}_3$ are shown in FIG. 3 only for two electrical connectors $\mathbf{312}_1$, $\mathbf{312}_2$, one in the form of a pin, the other in the form of a tab.

In the case of a straight tab, the electrical connector $\mathbf{312}_4$ projects in the main plane PP over a considerable length, for example at least one centimeter, in order to allow it to be connected. Moreover, the electrical connector $\mathbf{312}_4$ has a fixed end 314 secured to the main plate 306, this fixed end 314 having a considerable width, for example at least one centimeter, to allow current to pass through.

Furthermore, at least one of the electrical connection parts 304 also has at least one attachment tenon 322 for attaching to an overmolding of the power module 110, which will be described below with reference to FIG. 4. In the example described, multiple attachment tenons 322 are provided. The attachment tenons 322 are intended to retain the overmolding against the electrical connection parts 304. The attachment tenon(s) 322 of an electrical connection part 304 are thus separate from the electrical connector(s) $\mathbf{312}_1$, $\mathbf{312}_2$, $\mathbf{312}_3$, $\mathbf{312}_4$ possibly present on this electrical connection part 304. In particular, owing to its design, for example owing to its dimensions, each attachment tenon 322 does not make it possible to establish an electrical connection with another electrical conductor, and as a result is intended to remain free from any electrical connection to another electrical conductor.

Each attachment tenon 322 thus projects solely in one projection direction DP in the main plane PP, from an edge surface of the main plate 306 of this electrical connection part 304. This is in contrast to the electrical connectors $\mathbf{312}_1$ in the form of a pin and the electrical connectors in the form of a folded tab $\mathbf{312}_2$, $\mathbf{312}_3$, which have a vertically projecting vertical portion 316. For example, the projection direction DP of the attachment tenon 322 is substantially perpendicular to the edge surface of the main plate 306 from which the attachment tenon 322 projects. The attachment tenon 322 preferably has a length, in its projection direction DP, which is less than or equal to five millimeters and has a thickness E, identical to that of the main plate 306 in the example described, and a width L greater than or equal to its thickness E. This width L is preferably less than or equal to 5 millimeters. These dimensions are in contrast to those of the electrical connectors $312_4$ in the form of a straight tab.

Still preferably, the attachment tenons 322 are located on the outside of the power module 110. Thus, each attachment tenon 322 is located on an external edge surface portion of the main plate 306, that is to say an edge surface portion that does not delimit a gap 310.

As will be explained in detail with reference to FIGS. 21 to 23, the electrical connection parts 304 are obtained by being cut from a metal plate in the example described. Each attachment tenon 322 may thus be formed by a fastening lug residue resulting from making a cut in a fastening lug connecting, before the cutting, the main plate to another plate coplanar with said metal plate.

In the example described here, the metal plate is made of copper. As a variant, the metal plate could be made of aluminum or gold.

Furthermore, as explained above, the power module 110 has the transistors 112, 114, each of which is electrically connected between two upper faces 308 of respectively two of the main plates 306, for example for a power current which can be greater than one amp, for example, to pass and be interrupted on demand between these two main plates 306. Each transistor 112, 114 first of all has a lower face held against one of the two upper faces 308 to which this transistor is electrically connected. Each transistor 112, 114 moreover has an upper face, a portion of which is electrically connected to the other of the two upper faces, for example via one or more tapes 326 (as in the example shown) or wires. In the example described, the upper face of the transistor 112, 114 moreover has a control portion for controlling the transistor 112, 114, electrically connected to an upper face of a third main plate 306, for example via a wire 328 in the example described.

In the example described, the tapes 326 are made of aluminum and have dimensions of 2 mm×0.3 mm, for example. In one variant embodiment, the tapes 326 are made of gold.

In the example described, the wire 328 is made of aluminum and has a diameter of 0.2 mm. In a variant embodiment, the wire 328 is made of gold.

In the example described, the electrical connectors $312_1$ in the form of a pin serve to connect the power module 110 to the control module 210 in order to measure electrical variables and to control the transistors 112, 114.

Moreover, still in the example described, the electrical connectors $312_2$ are connected to the negative busbar 108 and the electrical connector $312_3$ is connected to the positive busbar 106.

Furthermore, still in the example described, the two electrical connectors $312_4$ in the form of a straight tab respectively form the two phase busbars 122 of the power module 110.

Figure 4:
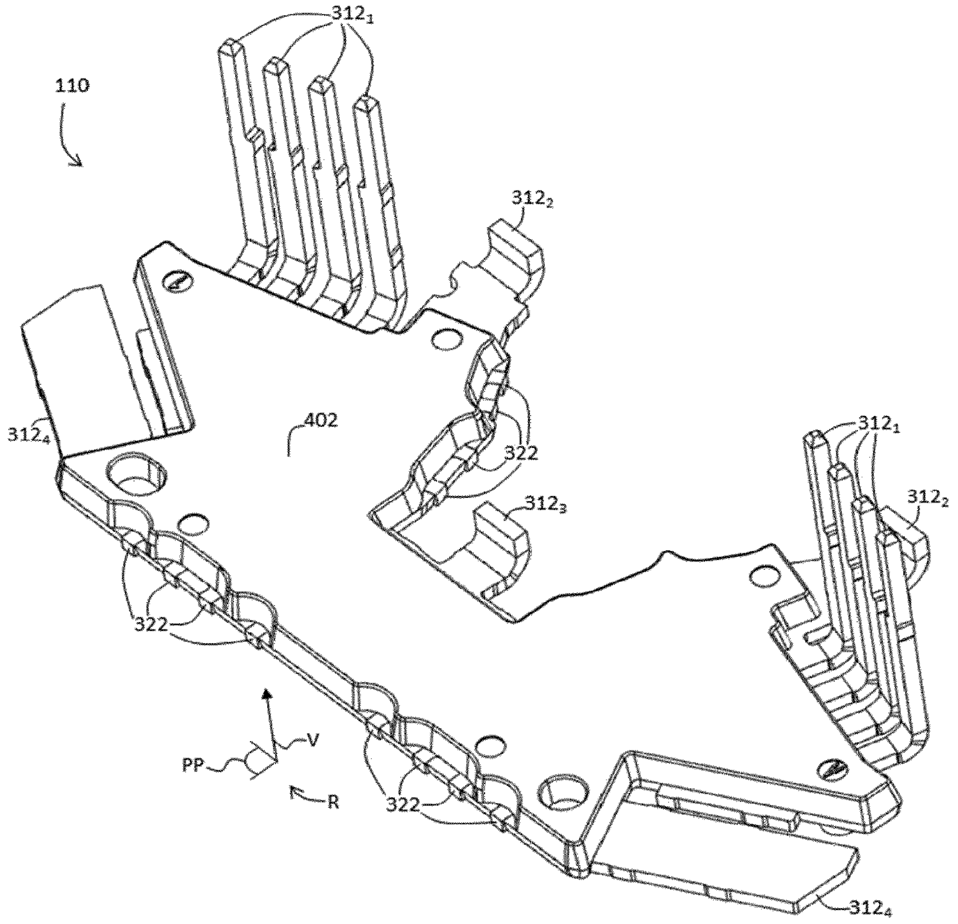
FIG. 4 is a view similar to that of FIG. 4, with overmolding.

With reference to FIG. 4, the overmolding of the power module 110 is shown and bears the reference 402. The overmolding 402 is an electrical insulator and completely covers each transistor 112, 114, each tape 326 and each wire 328 and at least a portion of the upper faces 308 of the main plates 306. The overmolding 402 is for example made of resin, by way of further example made of epoxy. Preferably, the overmolding 402 is integral in one single piece.

The overmolding 402 at least partially covers each attachment tenon 322. The contact surface area between the overmolding 402 and the connection parts 304 is increased compared to the case without a tenon, thereby making it possible for the main plates 306 to be better retained by the overmolding 402.

Figure 5:
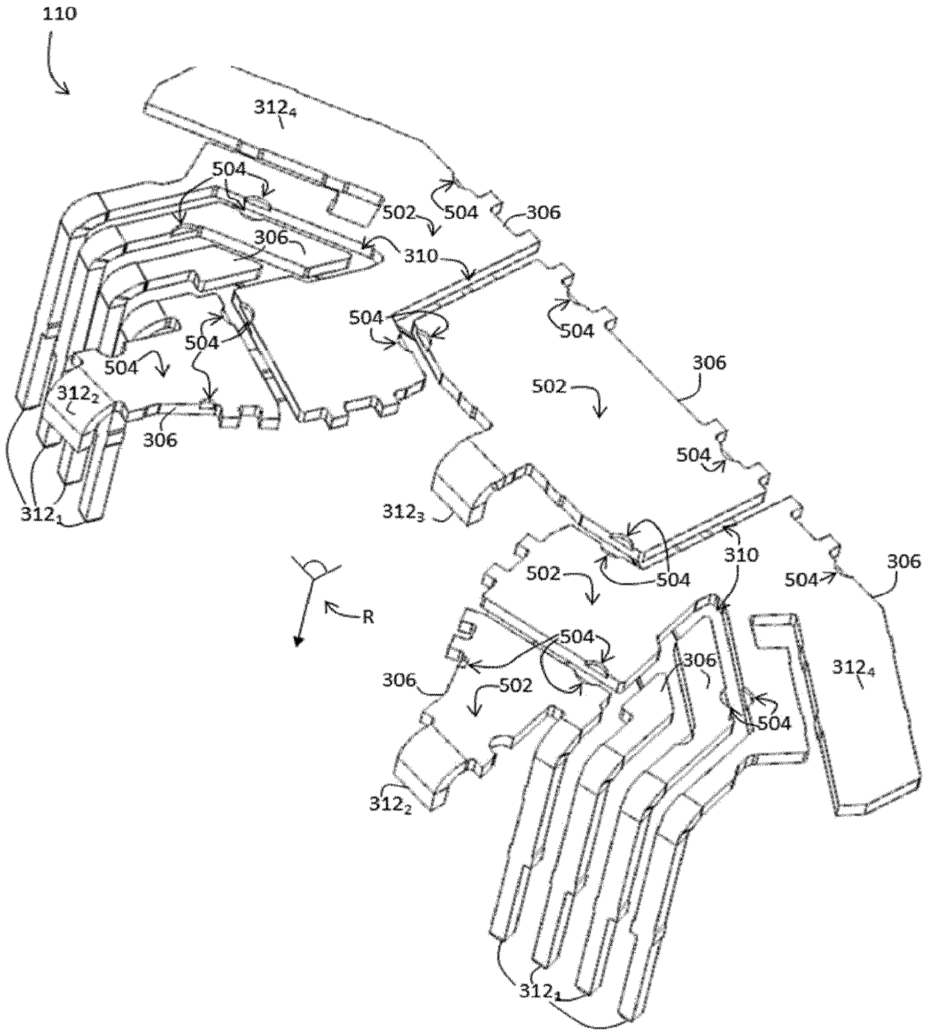
FIG. 5 is a three-dimensional bottom view of the power module of FIGS. 3 and 4, without overmolding.

With reference to FIG. 5, at least one of the main plates 306 has, on a lower face 502, at least one cavity 504 for retaining the overmolding 402. Each retaining cavity 504 is open on the edge surface of the main plate 306 having this cavity. In other words, the retaining cavity 504 is located at the periphery of the lower face 502 of the main plate 306. Moreover, each retaining cavity 504 defines a vertically offset horizontal step on top of the lower face 502 of the main plate 306. Each retaining cavity 504 is made by stamping, for example.

Figure 6:
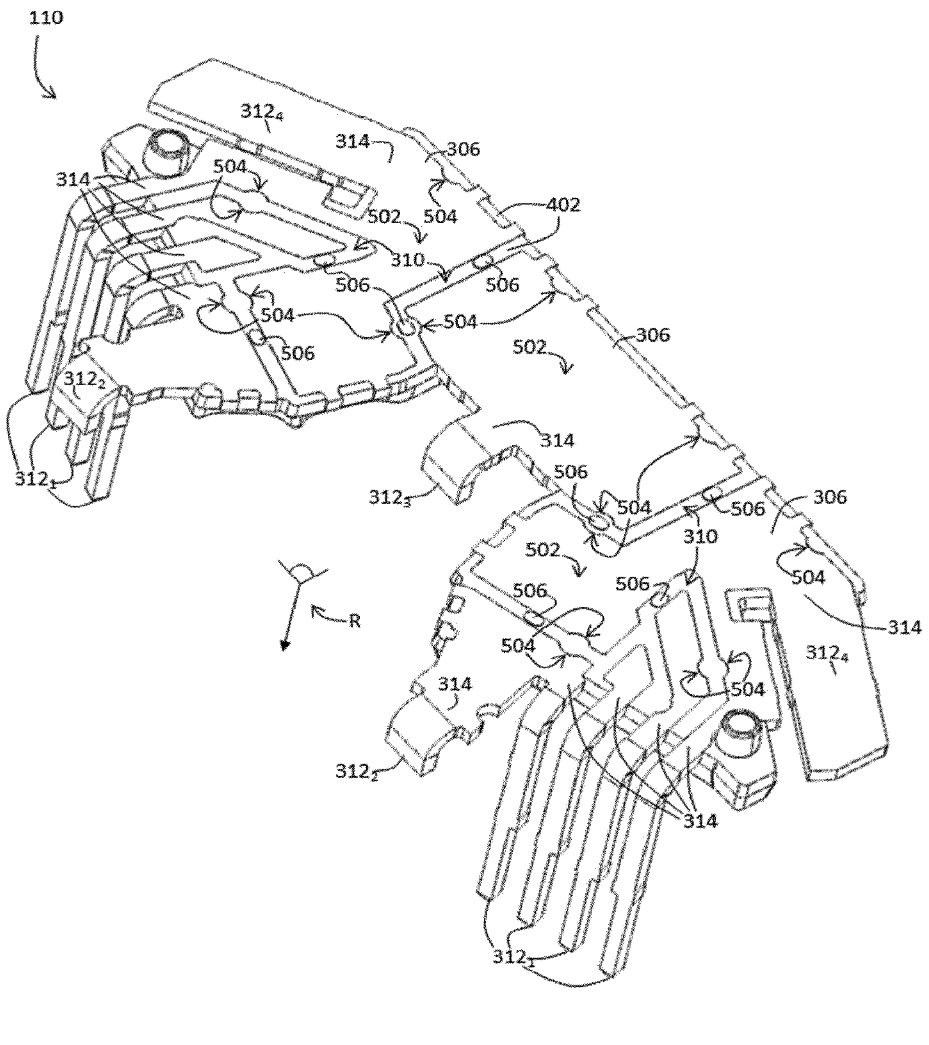
FIG. 6 is a view similar to that of FIG. 5, with overmolding.

As can be seen in FIG. 6, the overmolding 402 leaves visible at least a portion of the lower face 502 of the main plate 306 of each electrical connection part 304 comprising at least one electrical connector $312_1$, $312_2$, $312_3$, $312_4$. This part left visible is designed to be held against the heat sink 206. The heat sink 206 is thus in thermal contact with each part of the lower face 502 left visible by the overmolding 402. This thermal contact may be direct contact or contact via an electrically insulating and thermally conductive link element.

Moreover, each retaining cavity 504 is filled by the overmolding 402, and the overmolding 402 has, in this retaining cavity 504, a lower face flush with the lower face 502 of the main plate 206.

Furthermore, it will be appreciated that the fixed end 314 of each electrical connector $312_1$, $312_2$, $312_3$, $312_4$ has a lower face completely uncovered by the overmolding 402. Moreover, the overmolding 402 fills each gap 310 and has, in each gap 310, a lower face flush with the lower faces 502 of the main plates 206.

The overmolding 402 has at least one downwardly projecting pad 506 designed to come into direct contact with the heat sink 206 in order to define a predefined spacing between the lower faces 502 of the main plates 206 and the heat sink 206 and thus the thickness of the thermally conductive element filling this spacing. In the example described, each pad 506 projects from the lower face of the overmolding present in one of the gaps 310 between the main plates 206.

Figure 7:
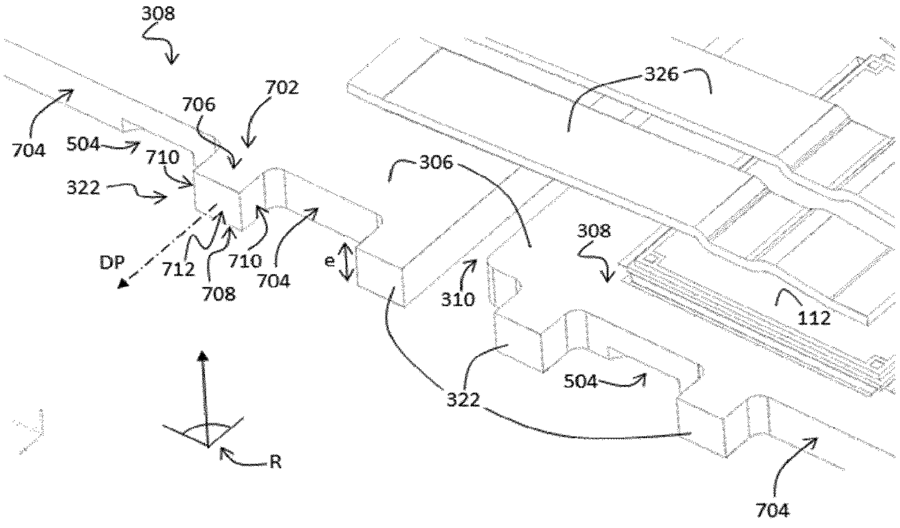
FIG. 7 is a three-dimensional top view of attachment tenons for attaching to the overmolding of the power module of FIGS. 3 to 6, without overmolding.

With reference to FIG. 7, each attachment tenon 322 has a fixed end 702 secured to the edge surface (denoted by the reference 704) of the main plate 306 bearing this attachment tenon 322. It also has an upper face 706, a lower face 708, two lateral faces 710 and a front face 712 forming a free end of the attachment tenon 322. For the sake of clarity, these various portions are indicated only for a single one of the attachment tenons 322, but it will be clear to a person skilled in the art that these portions are on the other attachment tenons 322. In the example described, each attachment tenon 322 has a thickness equal to that of the main plate 306 bearing it. Moreover, the upper face 706 of the attachment tenon also extends in the continuation of the upper face 308 of this main plate 306.

Figure 8:
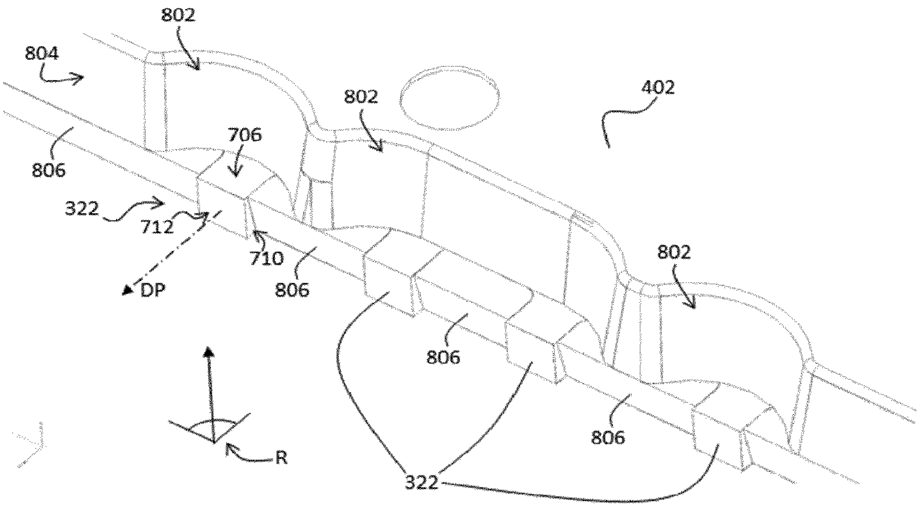
FIG. 8 is a view similar to that of FIG. 7, with overmolding.

With reference to FIG. 8, in general, the overmolding 402 at least partially covers one or more of the following: the lower face 708, the upper face 706, the lateral faces 710 and the front face 712 of each attachment tenon 322.

In the example illustrated, the overmolding 402 covers the majority of the lateral faces 710 of each attachment tenon 322 and leaves visible its front face 712, its lower face 708 and the majority of its upper face 706.

To cover the lateral faces 710, the overmolding 402 at least partially covers the edge surfaces 704 of the main plates 306, in particular between the two attachment tenons 322 of each pair of successive attachment tenons 322, notably those borne by the same main plate 306. This portion (indicated by the reference 806) of the overmolding 402 between the two attachment tenons 322 extends from one to the other of the two facing lateral faces 710 of these attachment tenons 322 and covers most of these two lateral faces 710.

To leave visible the upper faces 706 of the attachment tenons 322, the overmolding 402 has at least one cavity 802 in the form of an indentation in an edge surface 804 of the overmolding 402. The cavity 802 is open on the upper face of the overmolding 402. This cavity 802 thus at least partially uncovers the upper face 706 of at least one of the attachment tenon(s) 322.

Each attachment tenon 322 preferably projects beyond the overmolding 402 (that is to say, beyond the portions 806 in the example illustrated) in its projection direction DP by a distance of at least 1 mm.

Figure 9:
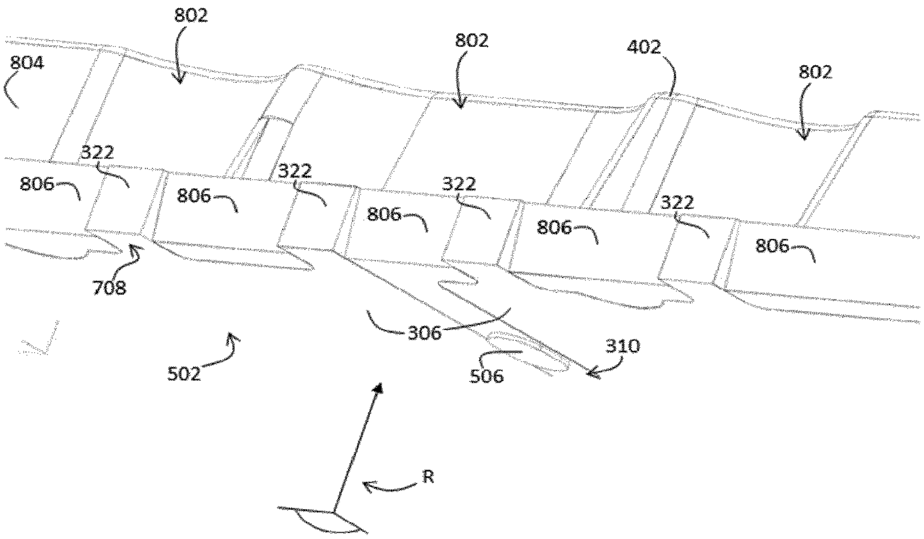
FIG. 9 is a three-dimensional bottom view of the attachment tenons of FIGS. 7 and 8, with overmolding.

With reference to FIG. 9, in the example described, the lower face 708 of the attachment tenon 322 extends in the continuation of the lower face 502 of the main plate 306. Moreover, the overmolding 402 does not go further downward than the lower faces 502 of the main plates 306 and leaves them entirely uncovered, similarly to the lower faces 708 of the attachment tenons 322.

Figure 10:
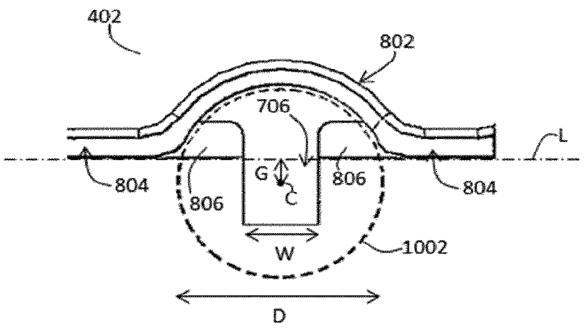
FIG. 10 is a top view of a cavity of the overmolding that uncovers an upper face of the attachment tenon.

With reference to FIG. 10, the cavity 802 delimits a free volume encompassing a right cylinder having a circular base 1002 in the main plane PP, this circular base 1002 having a diameter D of between 3 and 5 mm, preferably 4 mm, and a center C located at a distance G of between 0.5 and 1.5 mm, preferably 1 mm, from a line L of the main plane PP connecting the two portions of the edge surface 804 of the overmolding 402 surrounding the cavity 802. The center C of the circular base 1002 is preferably located vertically with respect to a middle of a width (for example parallel to the line L) of the attachment tenon 322 the upper face 706 of which is uncovered by the cavity 802.

Figure 11:
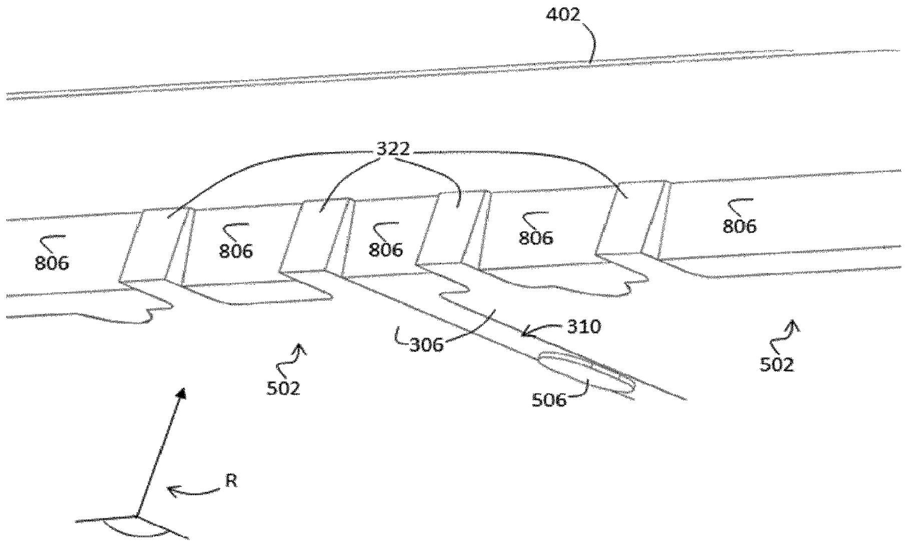
FIG. 11 is a three-dimensional bottom view of the attachment tenons in an alternative embodiment.
Figure 12:
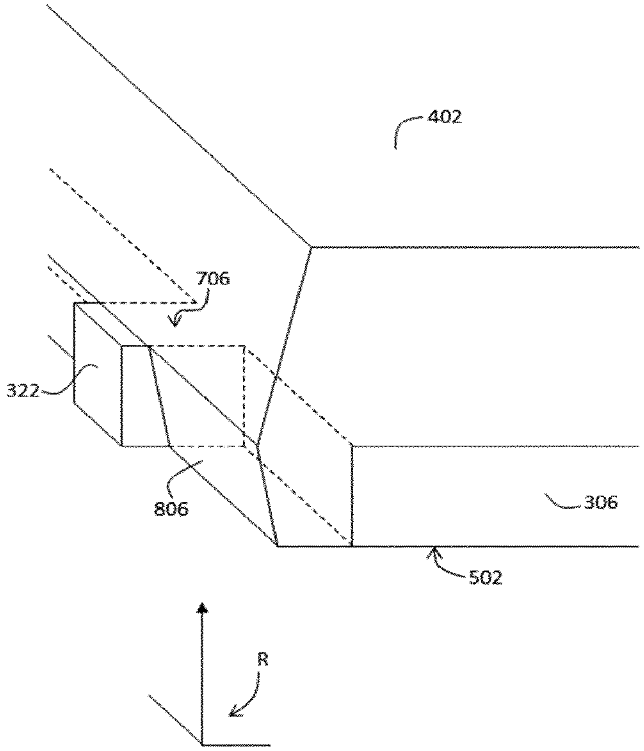
FIG. 12 is a three-dimensional view in section of the power module in the alternative embodiment of FIG. 11.

With reference to FIGS. 11 and 12, in another embodiment, the overmolding 402 does not have a cavity 802 for at least one of the attachment tenons 322, such that the overmolding 402 covers most of the upper face 706 of each of these attachment tenons 322.

Figure 13:
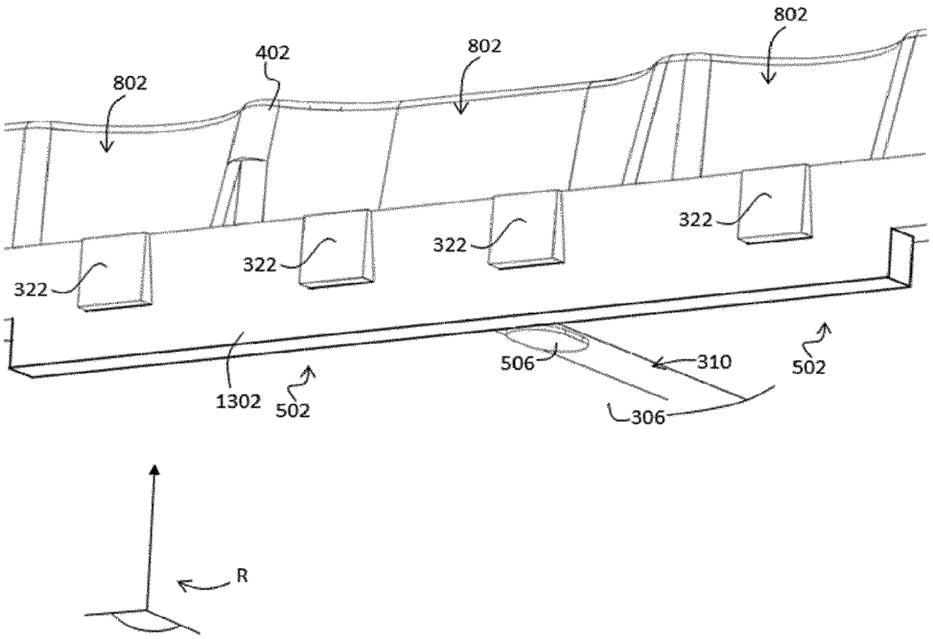
FIG. 13 is a three-dimensional bottom view of the attachment tenons in an alternative embodiment.
Figure 14:
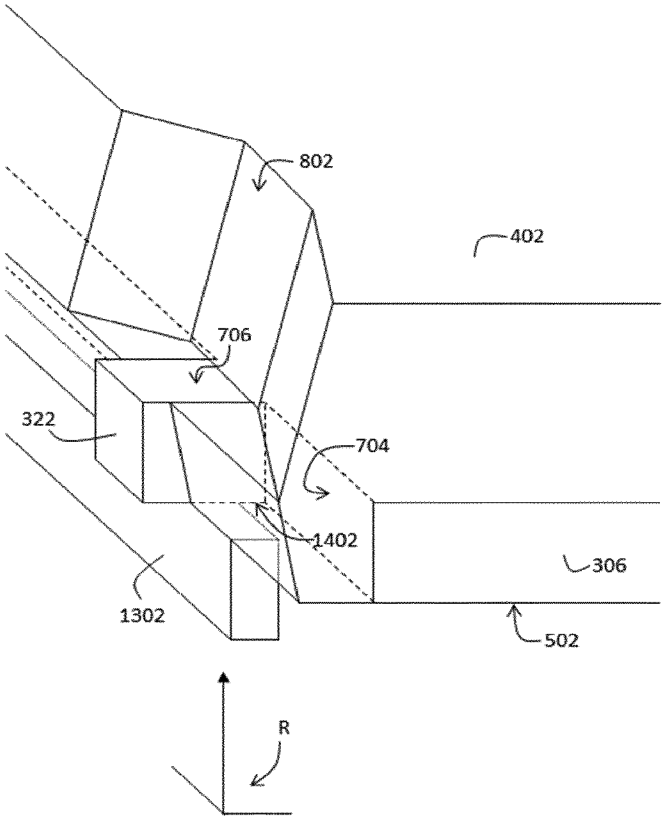
FIG. 14 is a three-dimensional view in section of the power module in the alternative embodiment of FIG. 13.

With reference to FIGS. 13 and 14, in another embodiment, the overmolding 402 does not have cavities 802 like in FIGS. 8 and 9 and moreover has a peripheral protuberance 1302 bordering at least a portion of an external edge of the overmolding 402 in the main plane and projecting further downward than the lower faces 502 of the main plates 306. This peripheral protuberance 1302 has for example the form of a low wall and at least partially covers the lower face 708 of at least one of the attachment tenons 322. More specifically, in the example described, the peripheral protuberance 1302 covers the lower face 708 over the entire width of the attachment tenon 322. Moreover, in the example illustrated in FIGS. 13 and 14, it will be appreciated that the peripheral protuberance 1302 covers the attachment tenon 322 at the front of its fixed end 702 so as to leave the portion of its lower face 708 located at its fixed end 702 uncovered. This portion is indicated by the reference 1402 in FIG. 14.

Figure 15:
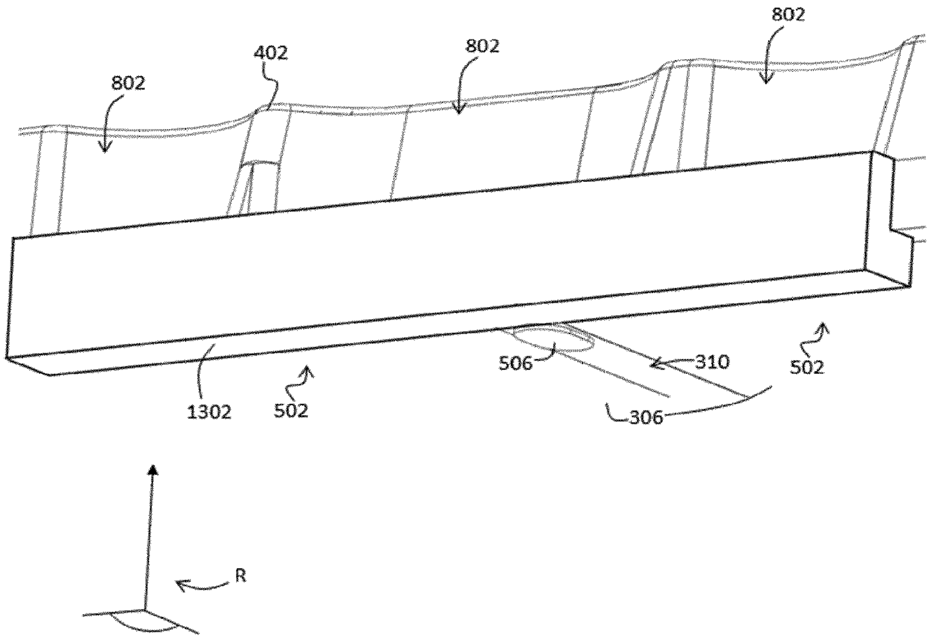
FIG. 15 is a three-dimensional bottom view of the attachment tenons in an alternative embodiment.
Figure 16:
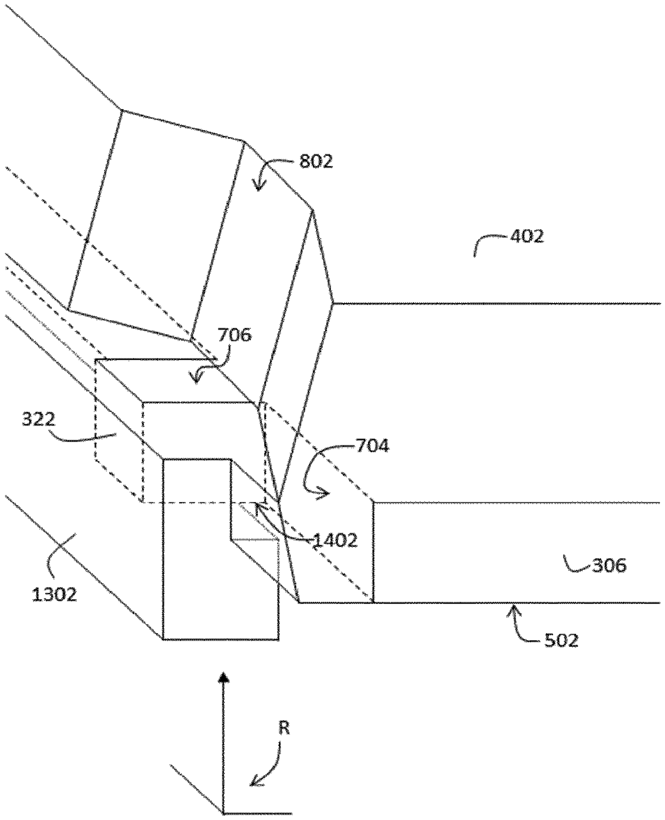
FIG. 16 is a three-dimensional view in section of the power module in the alternative embodiment of FIG. 15.

With reference to FIGS. 15 and 16, in another embodiment, the overmolding 402 is similar to that of FIGS. 13 and 14, except that it at least partially covers the front face 712 of at least one of the attachment tenons 322. In the example illustrated, the overmolding 402 completely covers the front face of the attachment tenon 322 shown.

Figure 17:
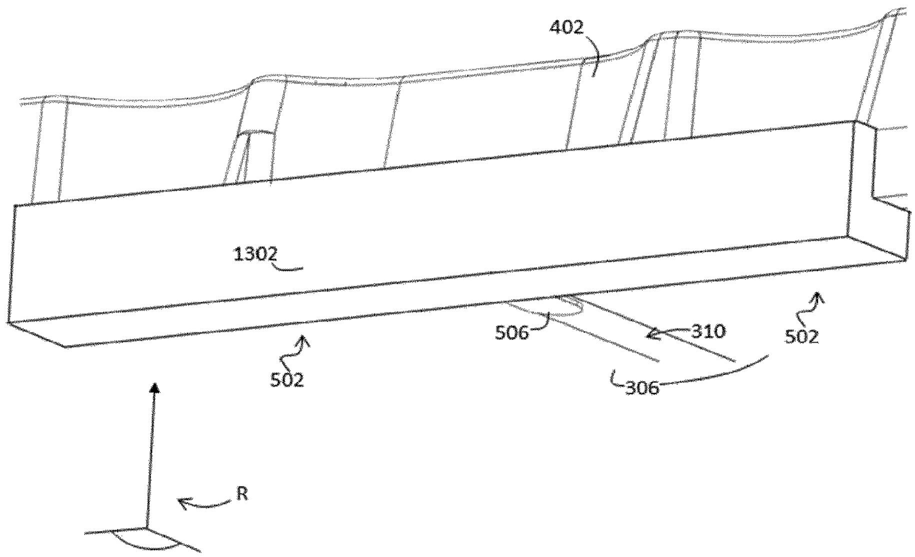
FIG. 17 is a three-dimensional bottom view of the attachment tenons in an alternative embodiment.
Figure 18:
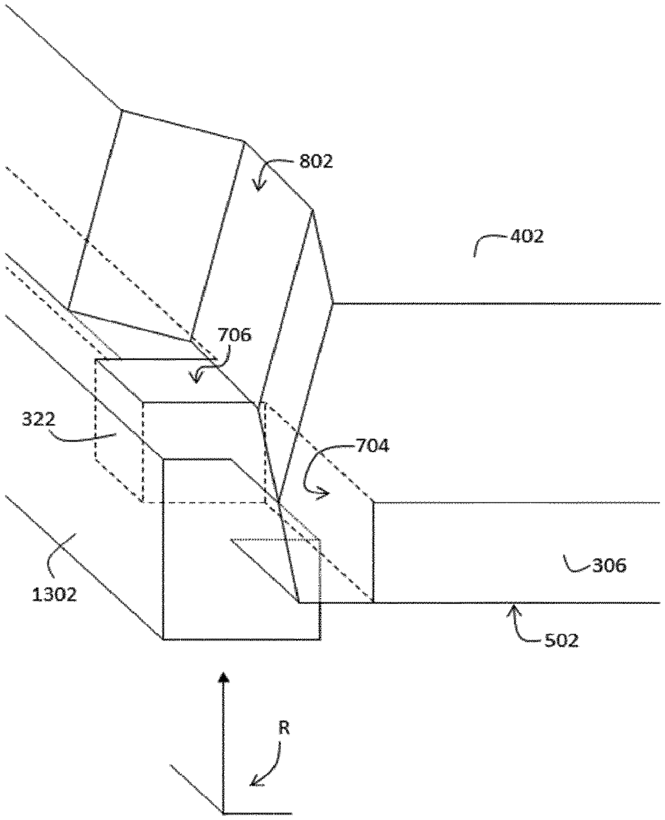
FIG. 18 is a three-dimensional view in section of the power module in the alternative embodiment of FIG. 17.

With reference to FIGS. 17 and 18, in another embodiment, the overmolding 402 completely covers at least one of the attachment tenons 322. In the example illustrated, the overmolding 402 is similar to that of FIGS. 15 and 16, except that it completely covers the lower face 708 of the attachment tenon 322 shown.

Figure 19:
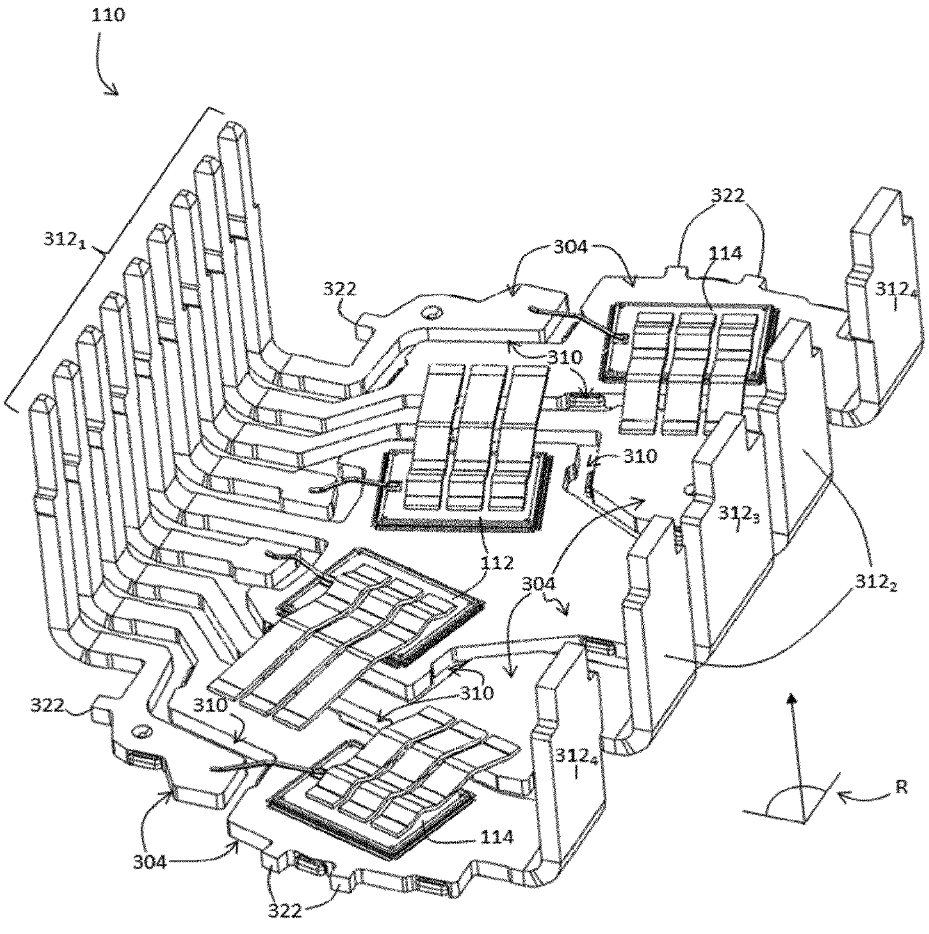
FIG. 19 is a three-dimensional view of another embodiment of the power module of the voltage converter of FIG. 1, without overmolding.
Figure 20:
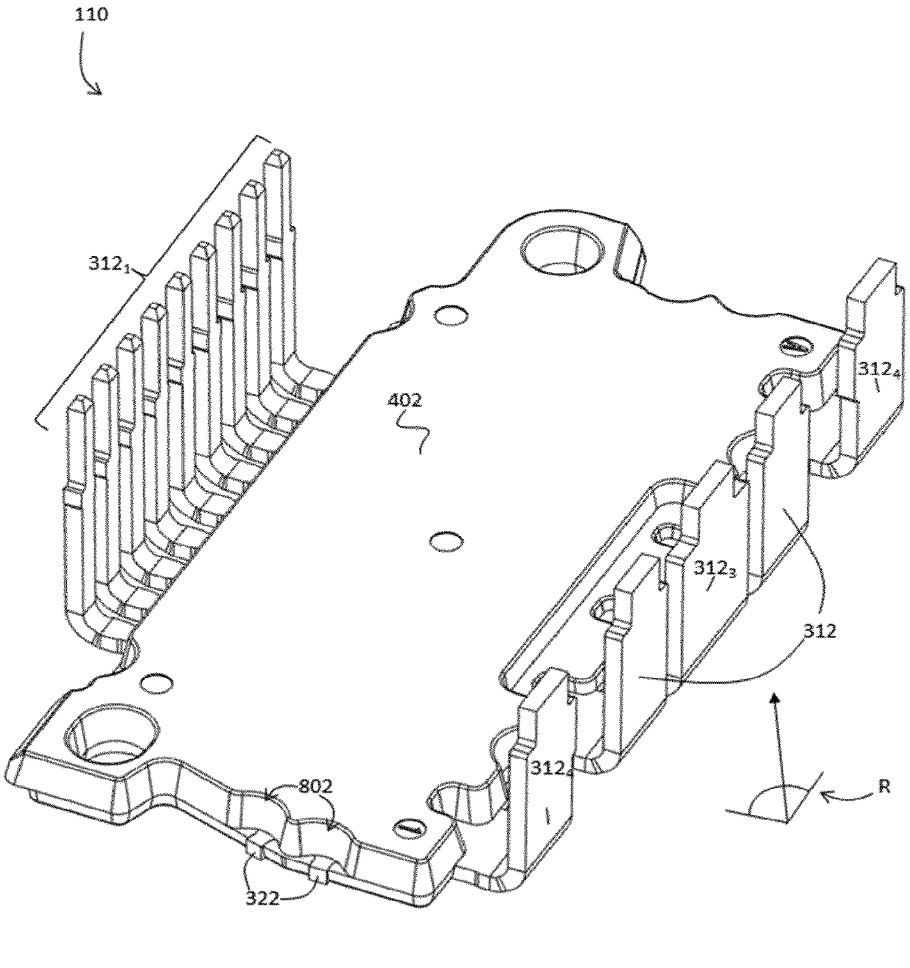
FIG. 20 is a view similar to that of FIG. 19, with overmolding.

Another embodiment of the power module 110 is illustrated in FIGS. 19 and 20. As will become apparent, this other embodiment has the same elements as the embodiment of FIGS. 3 to 10, these elements being denoted by the same references as before. The variant embodiments of FIGS. 11 to 18 are also applicable to the power module of FIGS. 19 and 20.

Figure 21:
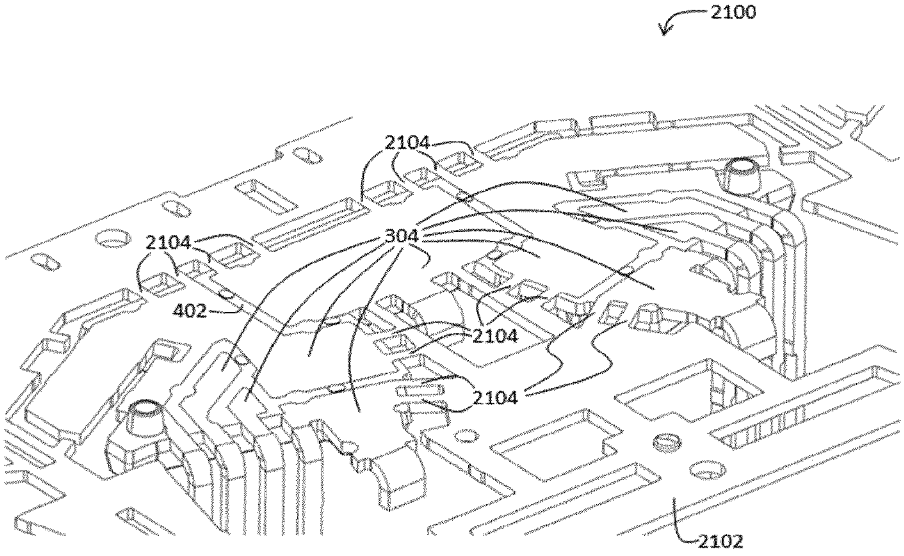
FIG. 21 is a three-dimensional bottom view of a plate that has been cut to form the electrical connection parts of the power module, with overmolding.
Figure 22:
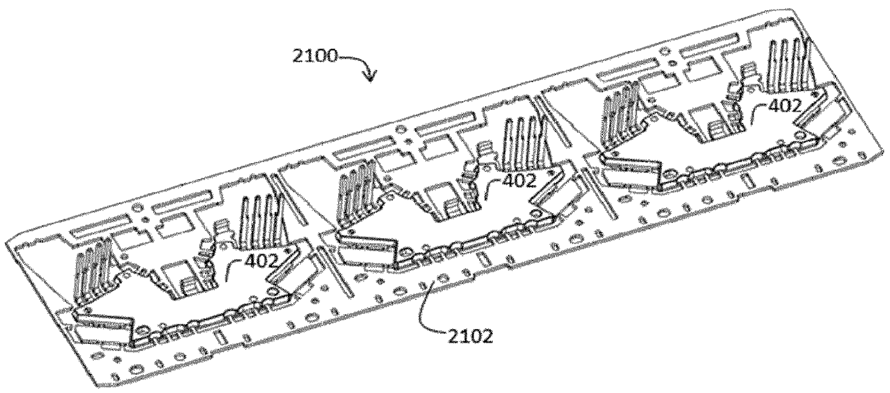
FIG. 22 is a three-dimensional top view of the cut plate of FIG. 21.

FIGS. 21 and 22 illustrate a conductive plate 2100, preferably made of metal, extending in the main plane and in which first of all there are cut multiple planar parts having a frame part 2102 and the electrical connection parts 304 of the power module 110 (that of FIGS. 3 to 10 in the example illustrated). As explained above, each electrical connection part 304 has a main plate and possibly at least one electrical connector projecting from its main plate. In FIGS. 21 and 22, the electrical connectors $312_1$, $312_2$, $312_3$ have been folded. Also formed in the conductive plate 2100 are fastening lugs 2104 for fastening each main plate to at least one of the other part(s) (other connection part 304 or frame part 2102). Also likewise formed in the conductive plate 2100 are secondary fastening lugs for fastening each electrical connection part that must be folded to at least one other electrical connection part or to the frame part 2102. In FIGS. 21 and 22, these secondary fastening lugs cannot be seen. The transistors 112, 114 are secured and electrically connected and the overmolding 402 has been made, in particular so as to entirely cover the transistors 112, 114 and at least a portion of the upper faces of the main plates, and also at least partially at least some of the fastening lugs 2104. In the example described, the overmolding 402 extends as far as the plane of the lower faces of the main plates of the connection parts 304.

Figure 23:
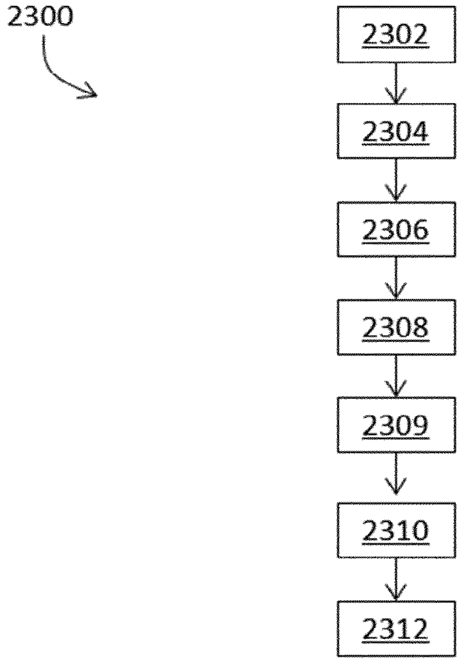
FIG. 23 illustrates the successive steps of a method for manufacturing a power module, according to one embodiment of the invention.

With reference to FIG. 23, a method 2300 for manufacturing the power module 110 will now be described.

In a step 2302, a conductive plate extending in a main plane is obtained.

In a step 2304, the conductive plate obtained in the preceding step is cut so as to define the frame part 2102 and the connection parts 304.

In a step 2306, the transistors 112, 114 are secured and electrically connected to the main plates 306 of the connection parts 304.

In a step 2308, the overmolding 402 is produced from an electrically insulating material, for example resin, so as to entirely cover the transistors 112, 114, at least a portion of the upper faces 308 of the main plates 306, and a portion of an upper face of some of the fastening lugs 2104 (those designed to form the attachment tenons 322). This step is preferably performed by casting or injection molding into a single mold cavity in one go. Further preferably, the mold has a shape delimiting, in the overmolding 402, each cavity 802 leaving the upper face of the fastening lugs 2104 designed to form the attachment tenons 322 at least partially uncovered.

In a step 2309, the secondary fastening lugs of the electrical connectors $312_1$, $312_2$, $312_3$ are cut.

In a step 2310, the electrical connectors $312_1$, $312_2$, $312_3$ are folded so as to place their main portions vertically in the example described, as illustrated in FIG. 20. The result of this step is illustrated in FIGS. 21 and 22.

In a step 2312, the fastening lugs 2104 are cut so as to separate each electrical connection part 304 from the other part(s). In the example described, this step first of all includes, for at least one fastening lug (preferably for all the fastening lugs), the placement of a reinforcing part against the upper face of this fastening lug, this upper face being uncovered by virtue of the presence of the cavity 802. Then, a cutting tool cuts this fastening lug 2104 from bottom to top in order to create a sheared effect with the reinforcing part. The presence of the reinforcing part makes it possible to avoid deformation of the overmolding while the cut is being made, which could damage it.

The presence of the cavity or cavities 802 thus makes it possible to uncover enough of the surface area of the upper face of the fastening lugs 2104 to allow the use of the reinforcing part mentioned above.

The fastening lugs 2104 are cut so as to leave, for each fastening lug 2104 covered by the overmolding 402, at least the portion covered by the overmolding 402 as fastening lug residue. This fastening lug residue thus forms one of the attachment tenons 322 described above.

In another embodiment, the overmolding 402 could be produced after the fastening lugs 2104 have been cut. The overmolding 402 then covers at least a fastening lug residue, thus forming an attachment tenon 322.

In yet another embodiment, the cutting of the fastening lugs 2104 includes cutting a first portion of the fastening lugs 2104 (those designed to form the attachment tenons 322), then producing the overmolding 422, and then cutting a second portion of the fastening lugs 2104.

In yet another embodiment, the production of the overmolding 402 includes producing a first portion of the overmolding (that shown in FIGS. 20 and 21), then cutting the fastening lugs 2104 (at least those designed to form the attachment tenons 322), and then producing, on the first portion of the overmolding, a second portion of the overmolding 402. In particular, the second portion of the overmolding can cover the front face of the attachment tenons 322, which would not be possible during the production of the first portion of the overmolding since the fastening lugs 2104 were not cut.

It is clearly evident that a power module such as those described above makes it possible to retain the overmolding to avoid it becoming detached.

It should also be noted that the invention is not limited to the embodiments described above. Indeed, it will become apparent to a person skilled in the art that various modifications can be made to the embodiments described above, in the light of the teaching that has just been disclosed to them.

In the detailed presentation of the invention given above, the terms that are used must not be understood as limiting the invention to the embodiments disclosed in the present description, but must be understood as including all the equivalents, the anticipation of which is within the scope of a person skilled in the art applying their general knowledge to the implementation of the teaching that has just been disclosed to them.

The invention claimed is:

1. A power module comprising:
- electrical connection parts, each having a main plate, the main plates extending in one and the same main plane so as to be substantially coplanar, at least one of the electrical connection parts comprising at least one electrical connector projecting from its main plate;
- at least one transistor electrically connected between two upper faces of respectively two of the main plates; and
- an electrically insulating overmolding covering each transistor and at least a portion of the upper faces of the main plates,
- wherein at least one of the electrical connection parts has at least one attachment tenon for attaching to the overmolding, each attachment tenon projecting solely in one projection direction in the main plane from an edge surface of the main plate of the at least one of the electrical connection parts,
- wherein the overmolding at least partially covers the attachment tenon,
- wherein each attachment tenon has:
  - a fixed end secured to the edge surface of the main plate,
  - an upper plate,
  - a lower plate,
  - two lateral faces, and
  - a front face,
- wherein the overmolding at least partially covers one or more of the following: the lower face, the upper face, the lateral faces and the front face of each attachment tenon, and
- wherein the overmolding has at least one cavity leaving the upper face of at least one of the attachment tenon(s) at least partially uncovered.

2. The power module as claimed in claim 1, wherein at least one of the main plates has, on a lower face, at least one cavity filled by the overmolding, and wherein the overmolding has, in the cavity, a lower face flush with the lower face of the main plate.

3. The power module as claimed in claim 2, wherein the electrical connection parts are obtained by being cut from a metal plate.

4. An electronic system comprising a heat sink and a power module as claimed in claim 2, and wherein the heat sink is in thermal contact with at least one lower face left visible by the overmolding.

5. A voltage converter comprising a power module as claimed in claim 2.

6. The power module as claimed in claim 1, wherein the electrical connection parts are obtained by being cut from a metal plate.

7. An electronic system comprising a heat sink and a power module as claimed in claim 6, and wherein the heat sink is in thermal contact with at least one lower face left visible by the overmolding.

8. The power module as claimed in claim 1, wherein the cavity delimits a free volume encompassing a right cylinder having a circular base in the main plane, the circular base having a diameter of between 3 and 5 mm, and a center located at a distance of between 0.5 and 1.5 mm, from a line of the main plane connecting the two portions of an edge surface of the overmolding surrounding the cavity.

9. The power module as claimed in claim 8, wherein the center of the circular base is located vertically with respect to a middle of a width of the attachment tenon.

10. The power module as claimed in claim 1, wherein the overmolding has a peripheral protuberance at least partially bordering an external edge of the overmolding in the main plane and projecting further downward than the lower face of the main plate(s), the peripheral protuberance at least partially covering the lower face of at least one of the attachment tenon(s).

11. The power module as claimed in claim 10, wherein the front face of at least one of the attachment tenon(s) that has a lower face covered by the peripheral protuberance is completely covered by the overmolding.

12. An electronic system comprising a heat sink and a power module as claimed in claim 1, and wherein the heat sink is in thermal contact with at least one lower face left visible by the overmolding.

13. A voltage converter comprising a power module as claimed in claim 1.

14. A method for manufacturing a power module, comprising the following steps:

obtaining a conductive plate, preferably made of metal, extending in a main plane;

cutting, from the conductive plate,, a frame part and multiple planar parts having at least two electrical connection parts each having a main plate, the main plates extending in the main plane so as to be substantially coplanar, at least one of the electrical connection parts comprising at least one electrical connector projecting from its main plate, and cutting, from the conductive plate, fastening lugs for fastening each main plate to at least one of the other part(s);

electrically connecting at least one transistor between two upper faces of respectively two main plates;

producing, with an electrically insulating material, an overmolding for the transistor and at least a portion of the upper faces of the main plates; and cutting the fastening lugs in order to separate each electrical connection part from the other part(s);

wherein the fastening lugs are cut so as to leave a fastening lug residue projecting from one of the main plates and forming an attachment tenon for attaching to the overmolding projecting from the main plate in the main plane, each attachment tenon projecting solely in one projection direction in the main plane from an edge surface of the main plate of this electrical connection part, and wherein the overmolding is produced so as to at least partially cover the attachment tenon.

* * * * *